United States Patent [19]

Hill et al.

[11] Patent Number: 5,434,091
[45] Date of Patent: Jul. 18, 1995

[54] METHOD FOR MAKING COLLECTOR UP BIPOLAR TRANSISTORS HAVING REDUCING JUNCTION CAPACITANCE AND INCREASING CURRENT GAIN

[75] Inventors: Darrell Hill, Plano; Shou-Kong Fan, Richardson; Ali Khatibzadeh, Plano, all of Tex.

[73] Assignee: Texas Instruments Incorporated, Dallas, Tex.

[21] Appl. No.: 320,792

[22] Filed: Oct. 7, 1994

Related U.S. Application Data

[63] Continuation of Ser. No. 969,605, Oct. 30, 1992, abandoned.

[51] Int. Cl.[6] ............................................. H01L 21/265
[52] U.S. Cl. .............................. 437/31; 148/DIG. 10; 148/DIG. 11; 148/DIG. 51; 148/DIG. 72; 257/197; 257/200; 257/593; 437/126; 437/133
[58] Field of Search ........................ 437/31, 126, 133; 148/DIG. 10, DIG. 11, DIG. 72, DIG. 51; 257/197, 200, 593

[56] References Cited

U.S. PATENT DOCUMENTS

| 4,389,831 | 12/1989 | Ishii et al. | 437/133 |
| 4,967,252 | 10/1990 | Awano | 357/34 |
| 5,024,958 | 6/1991 | Awano | 437/133 |
| 5,106,766 | 4/1992 | Lunardi | 437/31 |
| 5,124,270 | 6/1992 | Morizuka | 437/31 |
| 5,166,081 | 11/1992 | Inada et al. | 437/133 |
| 5,168,071 | 12/1992 | Fullowan et al. | 437/31 |
| 5,171,697 | 12/1992 | Liu | 437/133 |
| 5,252,500 | 10/1993 | Sato | 148/DIG. 11 |
| 5,266,819 | 11/1993 | Chang et al. | 257/198 |
| 5,298,439 | 3/1994 | Liu et al. | 437/126 |
| 5,318,916 | 6/1994 | Enquist et al. | 437/31 |
| 5,321,302 | 6/1994 | Shimawaki | 257/593 |

FOREIGN PATENT DOCUMENTS

| 0049661 | 3/1987 | Japan | 437/31 |
| 0102257 | 5/1988 | Japan | 437/31 |
| 1265559 | 10/1989 | Japan | 257/197 |
| 3108339 | 5/1991 | Japan | 257/197 |
| 3291942 | 12/1991 | Japan | 257/197 |

OTHER PUBLICATIONS

Analysis of the Emitter-Down Configuration of Double-Heterojunction Bipolar Transistor, Q. M. Zhang, et al. IEEE Transactions on Electron Devices, vol. 39, No. 10, Oct. 1992, pp. 2220–2228.

Primary Examiner—Olik Chaudhuri
Assistant Examiner—Long Pham
Attorney, Agent, or Firm—Michael K. Skrehot; James C. Kesterson; Richard L. Donaldson

[57] ABSTRACT

This is a method of fabricating a bipolar transistor on a wafer. The method can comprise: forming a doped emitter contact layer 31 on a substrate 30; forming a doped emitter layer 32 on top of the emitter contact layer, the emitter layer doped same conductivity type as the emitter contact layer; forming a doped base epilayer 34 on top of the emitter layer, the base epilayer doped conductivity type opposite of the emitter layer; forming a doped collector epilayer 36, the collector epilayer doped conductivity type opposite of the base layer to form the bipolar transistor; forming an collector contact 38 on top of the collector layer; forming a base contact 40 on top of the base layer; forming a emitter contact 44 on top of the emitter contact layer; and selective etching the emitter layer to produce an undercut 45 beneath the base layer.

11 Claims, 9 Drawing Sheets

METHOD FOR MAKING COLLECTOR UP BIPOLAR TRANSISTORS HAVING REDUCING JUNCTION CAPACITANCE AND INCREASING CURRENT GAIN

This application is a continuation, of application Ser. No. 07/969,605, filed Oct. 30, 1992 now abandoned.

FIELD OF THE INVENTION

This invention generally relates to reducing extrinsic base-collector capacitance in collector-up bipolar transistors.

CROSS-REFERENCE TO RELATED APPLICATIONS

The following coassigned patent is hereby incorporated herein by reference: U.S. Pat. No. 5,298,438.

BACKGROUND OF THE INVENTION

Without limiting the scope of the invention, its background is described in connection with the manufacturing of bipolar transistors, as an example.

Heretofore, in this field, in bipolar mesa transistors, the base layer extends outside the area of the active device region to enable contacting of the base. This area is called the extrinsic base region, outside the active device region. For collector-up transistors, that portion of the emitter-base junction in the extrinsic base area reduces the current gain, since minority carriers injected into the base in this area do not contribute to the collector current. Unless the emitter-base junction in the extrinsic base area is rendered inactive, the current gain may be unacceptably low.

Also, the extrinsic base region adds to the junction capacitance between the base layer and the layer beneath the base (the emitter, in collector-up devices). Since junction capacitance limits the high-frequency performance of bipolar transistors, great effort has been spent on reducing the junction capacitance.

SUMMARY OF THE INVENTION

It is herein recognized that a need exists for a method to manufacture a bipolar transistor which reduces the junction capacitance between the base layer and the layer beneath the base. The present invention is directed towards meeting that need.

Generally, and in one form of the invention, during device fabrication, the emitter layer (beneath the base) is etched laterally; a selective etch is used so that the base layer itself is not significantly affected. This removes the emitter-base junction in the extrinsic base region (e.g. under the base contacts). Current gain and emitter-base junction capacitance are significantly improved.

The selective etching can be accomplished in at least two ways: by including an epitaxial layer in the emitter which can be selectively removed during fabrication; or by using a doping-selective etch which, for npn transistors, removes only n-type material but not p-type material (or vice versa for pnp transistors).

Previous partial solutions include ion implantation and ion bombardment of the extrinsic base region.

In the ion implantation approach, which is applicable for heterojunction bipolar transistors, acceptor ions (for npn devices, or donor ions for pnp) are implanted in the extrinsic base region and then annealed to move the p-n junction into the wide bandgap material. The junction therefore becomes a wide-bandgap homojunction. Since the turn-on voltage is higher, the current density is much lower in the extrinsic base region than in the active device region.

In the ion bombardment approach, the emitter in the extrinsic base region is rendered very resistive by implant damage, reducing the current density in this region.

Both of the existing solutions rely on ion implantation through the base layer; the invention relies instead on lateral etching to undercut the emitter in the extrinsic base region. Because of ion implantation, the existing solutions, even after annealing, have residual damage in the base layer, which increases the resistance of the base and degrades the current gain. The invention does not require ion implantation and does not suffer from the associated problems.

Also the existing solutions do not significantly reduce the junction capacitance. In fact, the ion implantation approach actually increases the undesirable capacitance between the base and emitter. The invention, however, can substantially reduce the emitter-base junction capacitance.

This invention would be of great use in, although not limited to, microwave amplification or oscillator applications requiring heterojunction bipolar transistors (HBT) devices to operate above 20 GHz, since conventional HBTs are usually sufficient at lower frequencies.

This is a method of fabricating a bipolar transistor on a wafer. The method can comprise: forming a doped emitter contact layer on a substrate; forming a doped emitter layer on top of the emitter contact layer, the emitter layer doped same conductivity type as the emitter contact layer; forming a doped base epilayer on top of the emitter layer, the base epilayer doped conductivity type opposite of the emitter layer; forming a doped collector epilayer, the collector epilayer doped conductivity type opposite of the base layer to form the bipolar transistor; forming an collector contact on top of the collector layer; forming a base contact on top of the base layer; forming a emitter contact on top of the emitter contact layer; and selective etching the emitter layer to produce an undercut beneath the base layer.

Preferably, the emitter layer is composed of or contains an AlGaAs layer and the emitter contact layer is composed of GaAs and the AlGaAs emitter layer is selectively etched to produce the undercut region beneath the base layer.

BRIEF DESCRIPTION OF THE DRAWINGS

The drawings are schematic and the vertical has been exaggerated for clarity.

DETAILED DESCRIPTION OF THE DRAWINGS

The first preferred embodiment method for fabricating bipolar transistors includes the following steps as illustrated in cross sectional elevation views in FIGS. 1–10.

Figure 1:
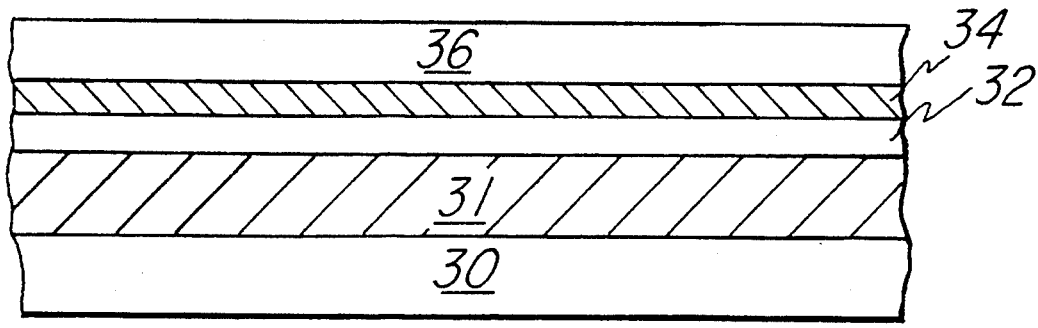
FIGS. 1–10 are cross sectional elevation views of the first preferred embodiment and the steps of the preferred embodiment fabrication method.

In FIG. 1, a substrate material 30 is composed of a semiconductor material, such as GaAs. Emitter contact layer 31 of n-type GaAs is deposited onto substrate 30 with doping $3\times10^{18}$ cm$^{-3}$ and thickness of 500 nm. Emitter epilayer 32 of n-type AlGaAs is deposited at a thickness of 50 nm and doping of $2\times10^{17}$ cm$^{-5}$. A base epilayer 34 of GaAs is deposited on to the emitter 32 at a thickness of 50 nm and doped with C at a concentration of $5\times10^{19}$ cm$^{-3}$. A collector layer 36 is grown consisting of 500 nm doped n-type at $3\times10^{16}$ cm$^{-3}$ followed by 100 nm doped n-type at $5\times10^{18}$ cm$^{-3}$. The collector layer 36 is composed of GaAs and/or AlGaAs.

Figure 2:
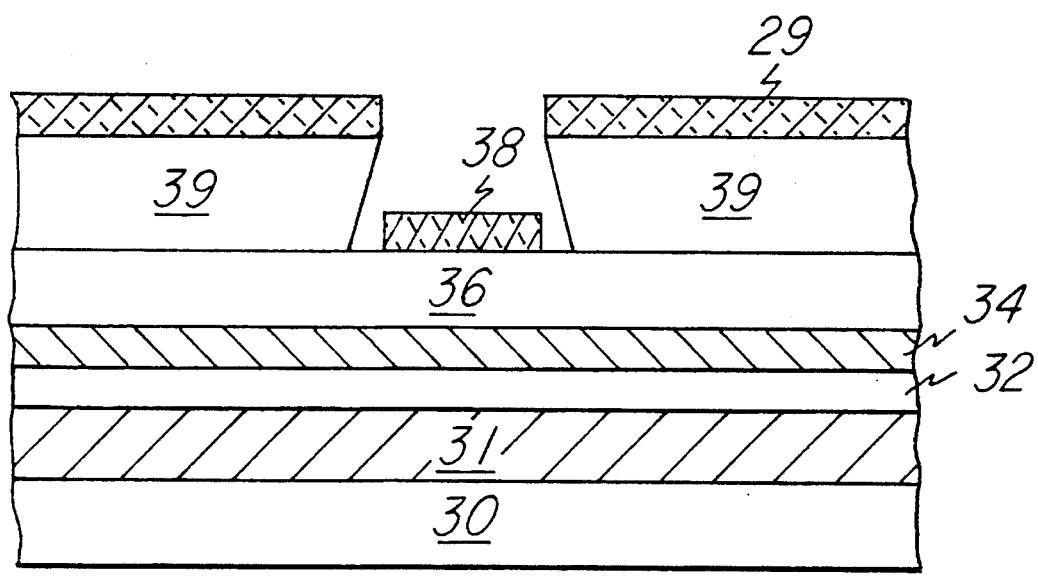

In FIG. 2, photoresist 39 is applied and patterned by lithography. Then, 50 nm thick AuGe emitter ohmic contact metal, followed by 14 nm Ni and 200 nm Au layers are evaporated onto the collector 36. The excess metal 29 on top of the photoresist 39 is then lifted off by dissolving the photoresist in acetone. The contacts are then alloyed by heating to 430 degrees Celsius for 1 minute.

Figure 3:
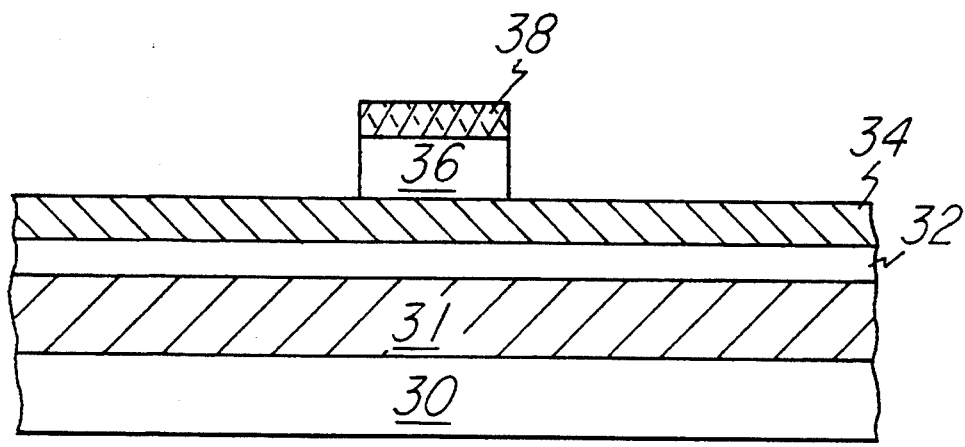

In FIG. 3, the collector layer 36 is etched using the collector contact 38 as a mask.

Figure 4:
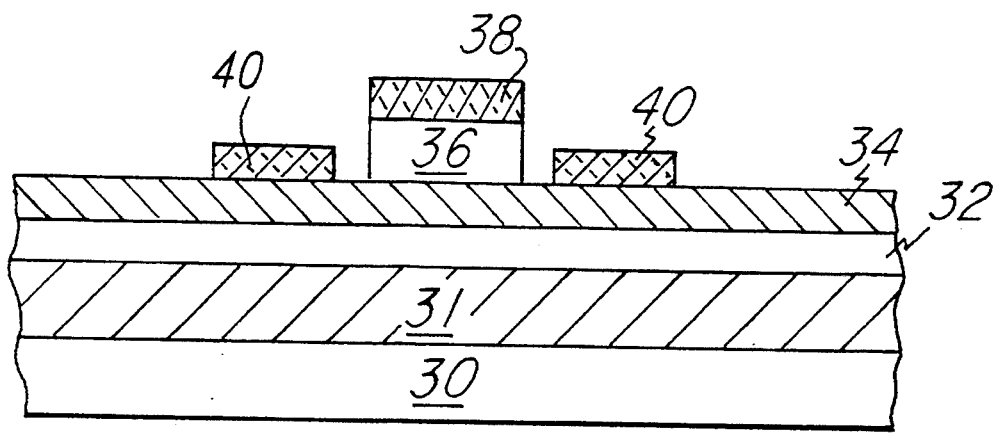

In FIG. 4, the base contacts 40 are evaporated onto the base layer 34 using a lift-off process. The base contact 40 metal consists of 50 nm Ti, 25 nm Pt, and 200 nm Au.

Figure 5:
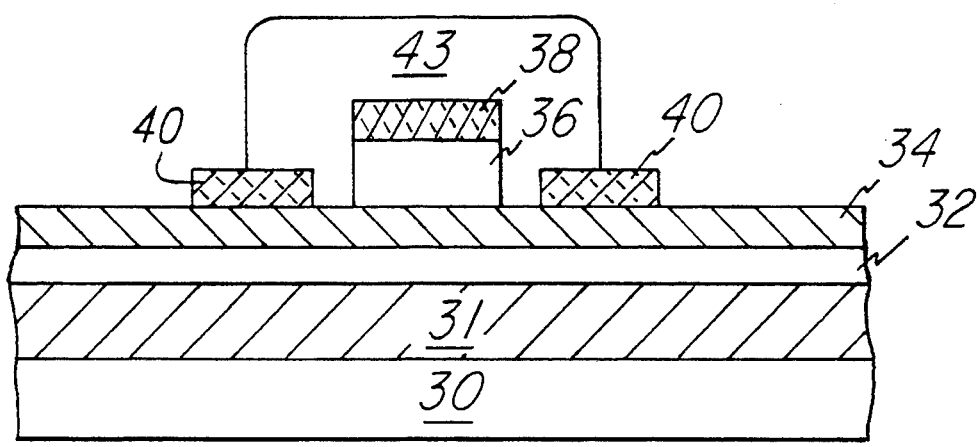

In FIG. 5, a layer of photoresist 43 is deposited and patterned over the collector and portions of the base contacts.

Figure 6:
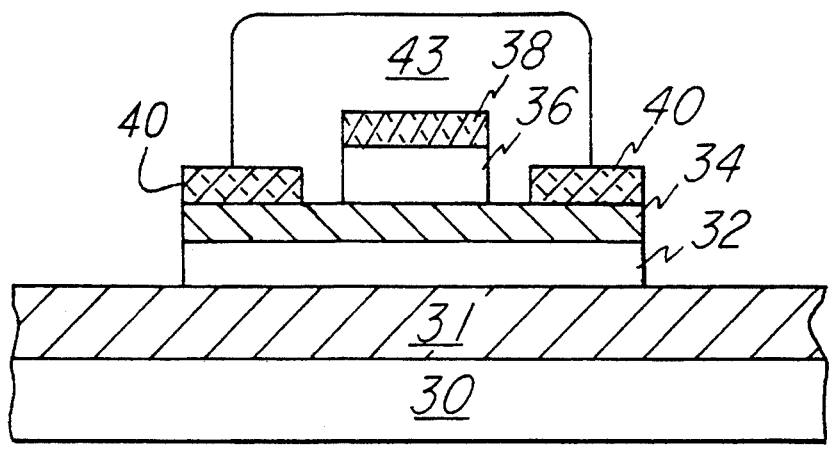

In FIG. 6, both the base layer 34 and the emitter layer 32 are etched using the base contact 40 and photoresist 43 as a mask.

Figure 7:
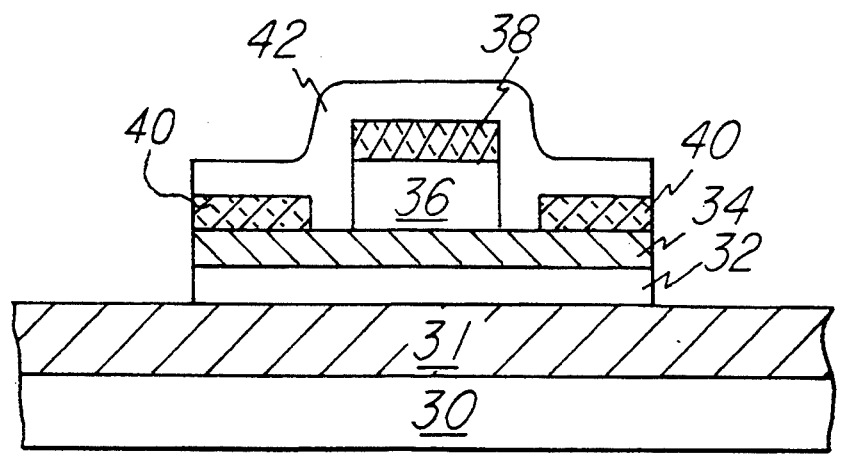

In FIG. 7, a layer of silicon nitride 42 is deposited over the base contact 40, the collector 36 and the collector contact 38 to protect the optional AlGaAs in the collector.

Figure 8:
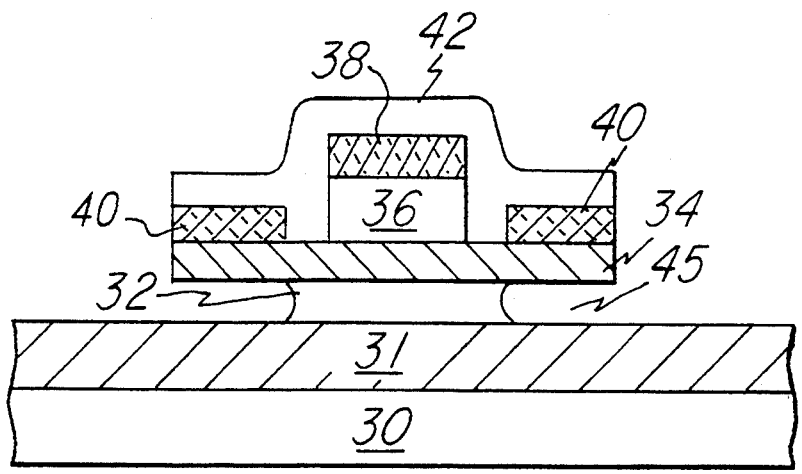

In FIG. 8, a timed selective etch is used to etch the AlGaAs of the emitter layer 32 and produce an undercut 45 beneath the base layer 34.

Figure 9:
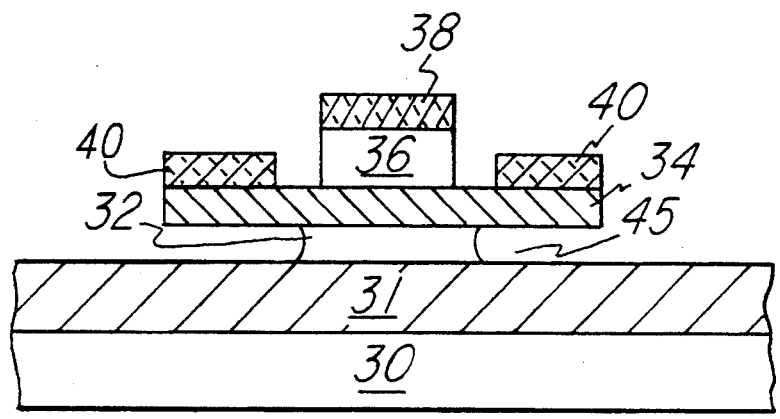

In FIG. 9, the layer of silicon nitride is removed.

Figure 10:
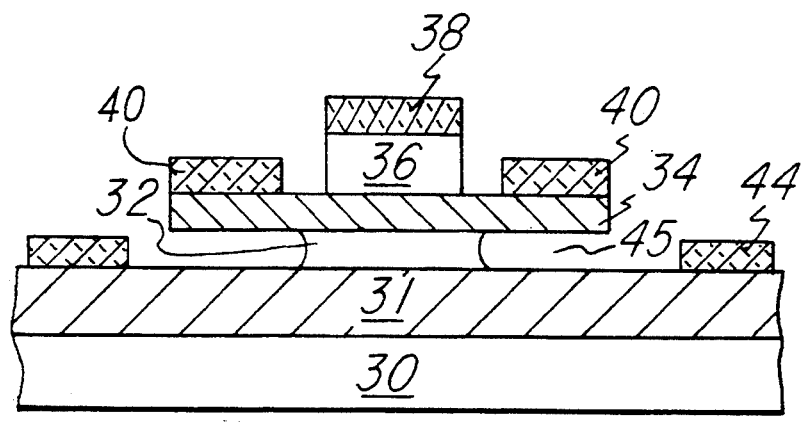

In FIG. 10, using a lift-off process, the emitter contact metal 44 is evaporated, consisting of 50 nm AuGe, 14 nm Ni, and 200 nm Au. Ohmic contacts are alloyed at 430 degrees C. for 1 minute.

The second preferred embodiment method for fabricating high power heterojunction bipolar transistors (HBTs) includes the following steps as illustrated in cross sectional elevation views in FIGS. 11-22. In the second preferred embodiment, ion implantation is used to convert the lower portion of the collector in the extrinsic base region to the doping type of the base to reduce the extrinsic base resistance. The base-emitter capacitance is not affected by this implant, because the implanted material is separated from the emitter by the air gap produced by the undercut etch.

The fabrication of the second preferred embodiment is similar to that of the first embodiment, except that the etch to the base is replaced by an etch which stops short of the base, leaving a portion of the collector on the surface of the extrinsic base regions. This portion is converted to the same type as the base by diffusion or ion implantation. The emitter metal or photoresist may be used to protect the active device region under the emitter contact during the diffusion or implantation.

Figure 11:
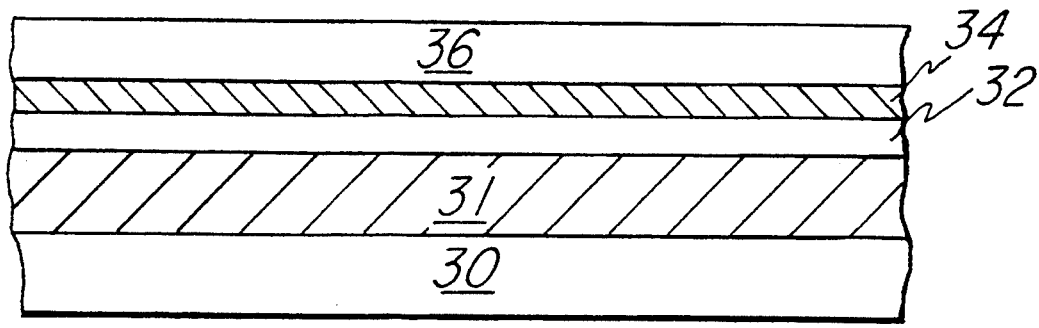
FIGS. 11–22 are cross sectional elevation views of the second preferred embodiment and the steps of the second preferred embodiment fabrication method.

In FIG. 11, a substrate material 30 is composed of a semiconductor material, such as GaAs. Emitter contact layer 31 of n-type GaAs is deposited onto substrate 30 with doping $3\times10^{18}$ cm$^{-3}$ and thickness of 500 nm. Emitter epilayer 32 of n-type AlGaAs is deposited at a thickness of 50 nm and doping of $2\times10^{17}$ cm$^{-3}$. A base epilayer 34 of GaAs is deposited on to the emitter 32 at a thickness of 50 nm and doped with C at a concentration of $5\times10^{19}$ cm$^{-3}$. A collector layer 36 is grown consisting of 500 nm doped n-type at $3\times10^{16}$ cm$^{-3}$. Followed by 100 nm doped n-type at $5\times10^{18}$ cm$^{-3}$. The collector layer 36 is composed of GaAs and/or AlGaAs.

Figure 12:
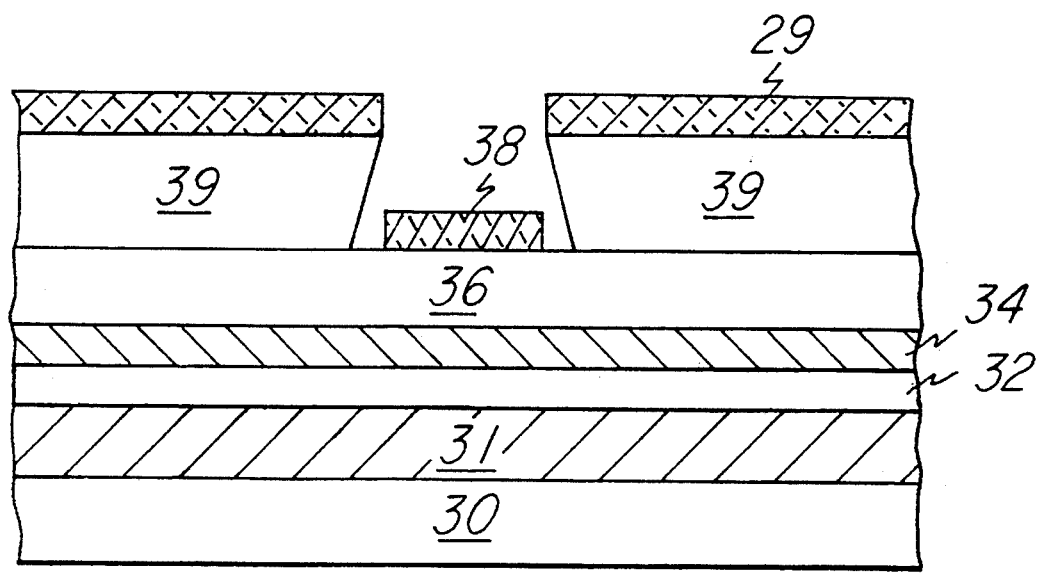

In FIG. 12, photoresist 39 is applied and patterned by lithography. Then, 50 nm thick AuGe emitter ohmic contact metal, followed by 14 nm Ni and 200 nm Au layers are evaporated onto the collector 36. The excess metal 29 on top of the photoresist 39 is then lifted off by dissolving the photoresist in acetone. The contacts are then alloyed by heating to 430 degrees Celsius for 1 minute.

Figure 13:
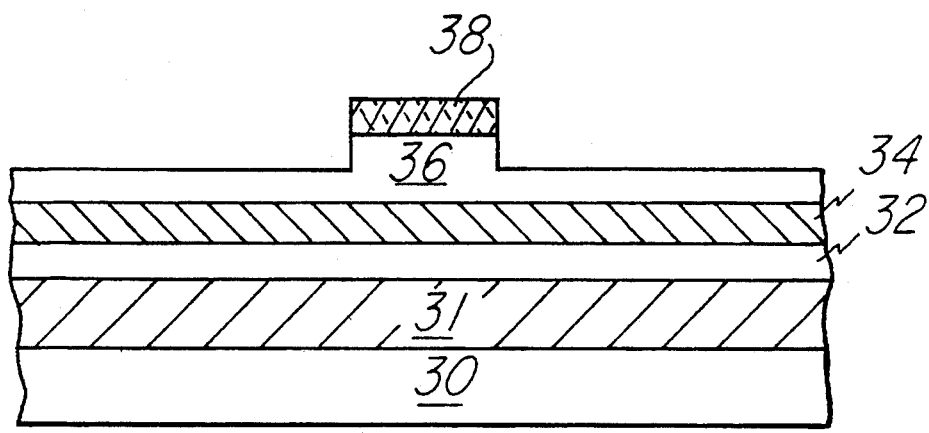

In FIG. 13, the collector layer 36 is partially etched using the collector contact 38 as a mask.

Figure 14:
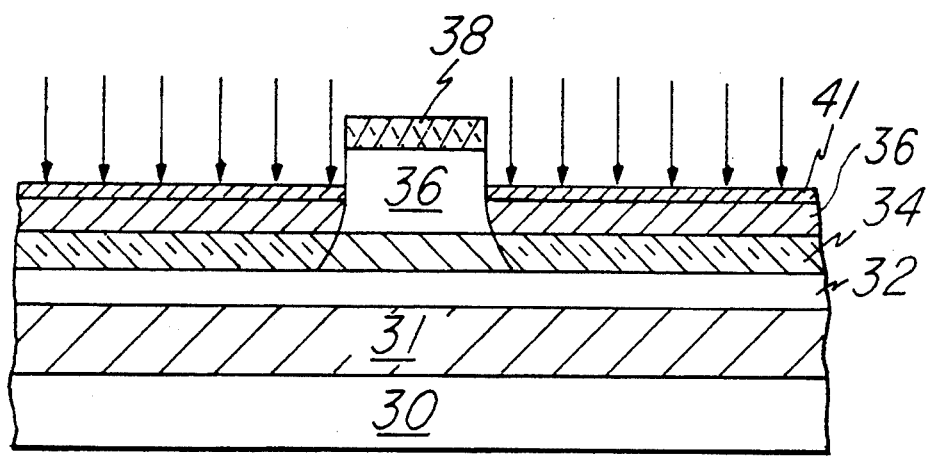

In FIG. 14, 40 nm of silicon nitride 41 is deposited on top of the partially etched collector layer 36. The structure is then ion implanted (for example, Be at 60 keV to a dose of $1\times10^{14}$ cm$^{-2}$) to convert the remaining portion of the collector layer 36 immediately above the base layer in the extrinsic base region. The collector contact or photoresist may act as a mask. The structure is then annealed at 800° C. for 30 seconds to activate the implant.

Figure 15:
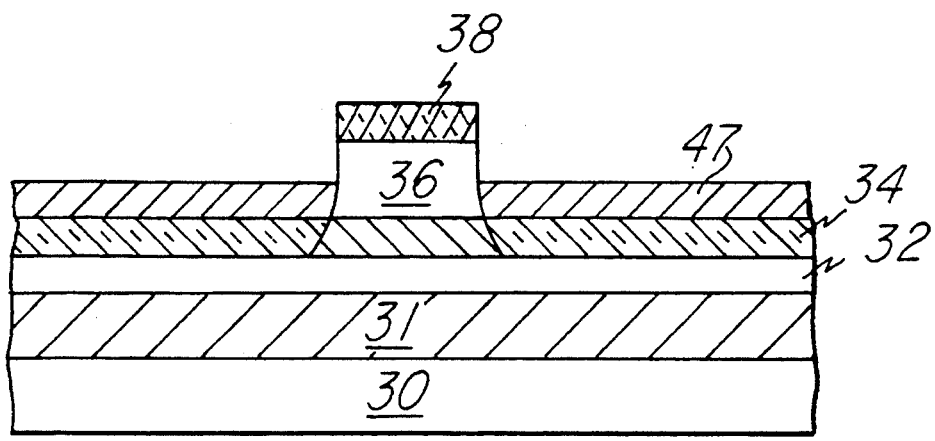

In FIG. 15, the silicon nitride is then removed to leave a ion-implanted portion 47 of the collector layer 36.

Figure 16:
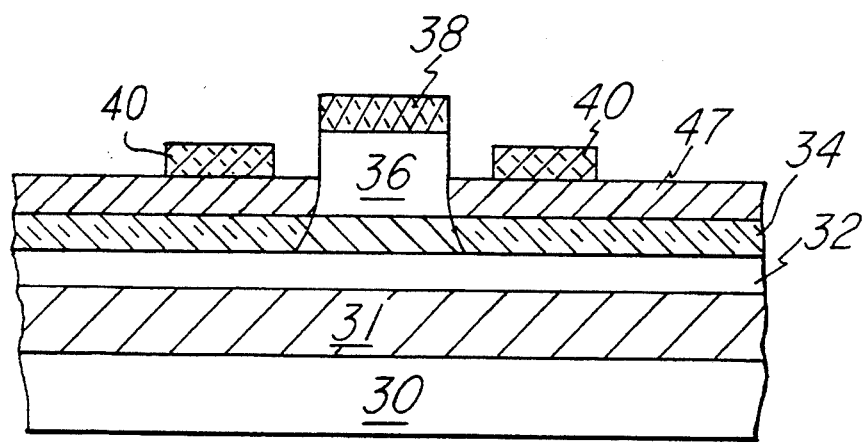

In FIG. 16, the base contacts 40 are evaporated onto the ion-implanted layer 47 using a lift-off process. The base contact metal consists of 10 nm Au, 150 nm AuZn, and 100 nm Au.

Figure 17:
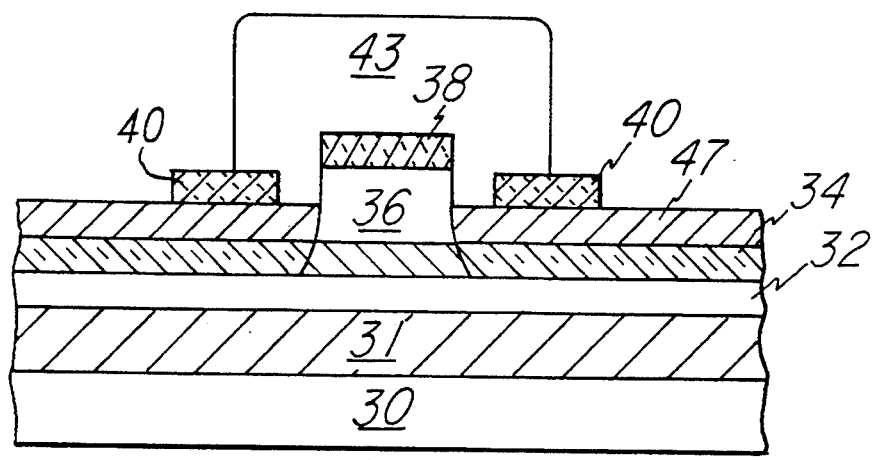

In FIG. 17, a layer of photoresist 43 is deposited and patterned over the collector and portions of the base contacts.

Figure 18:
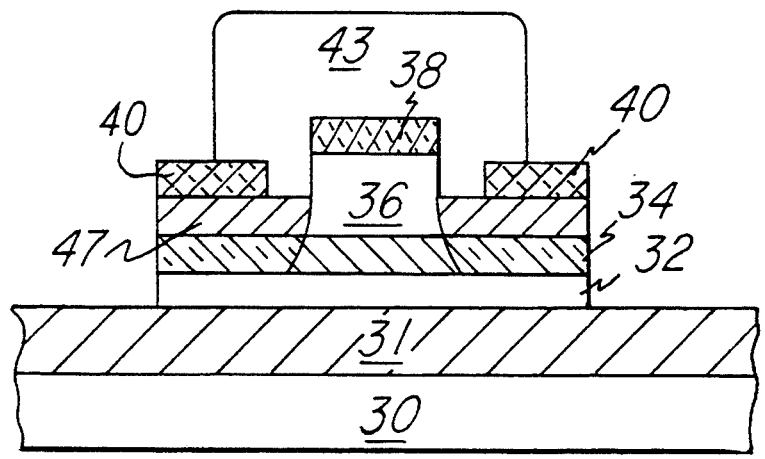

In FIG. 18, the doped portions of the collector layer 36, the base layer 34, and the emitter layer 32 are etched using the base contact 40 and photoresist 43 as a mask.

Figure 19:
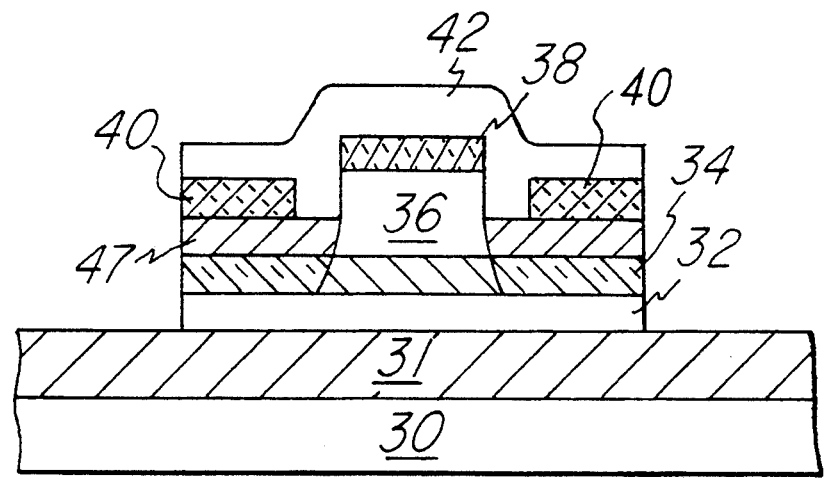

In FIG. 19, a layer of silicon nitride 42 is deposited over the base contact 40, the collector 36 and the collector contact 38 to protect the optional AlGaAs in the collector.

Figure 20:
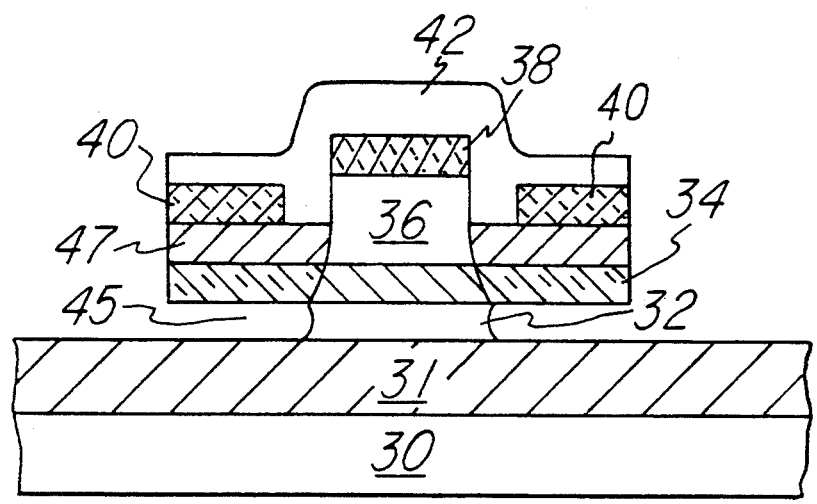

In FIG. 20, a timed selective etch is used to etch the emitter layer 32 and produce an undercut 45 beneath the base layer 34. The selective etch may be either dopant selective or material selective.

Figure 21:
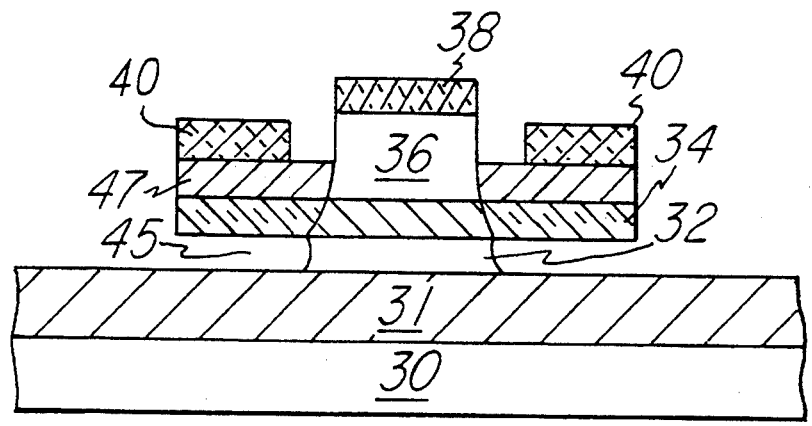

In FIG. 21, the layer of silicon nitride is removed.

Figure 22:
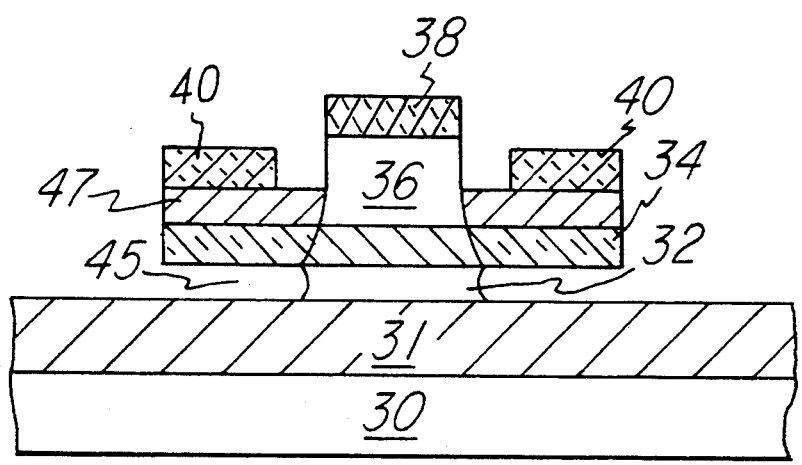

In FIG. 22, using a lift-off process, the emitter contact metal 44 is evaporated, consisting of 50 nm AuGe, 14 nm Ni, and 200 nm Au. Ohmic contacts are then alloyed at 430 degrees C. for 1 minute.

Although GaAs/AlGaAs or GaAs/GaInP combinations are preferred for the bipolar transistor, because those materials are especially applicable to high frequency transistors, silicon may also be used with a dopant selective etch to create the undercut region beneath the base.

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a bipolar transistor, comprising the steps of:
   a. providing a material structure comprising:
      a substrate;
      an emitter contact layer over said substrate;
      an emitter layer over said emitter contact layer;
      a base layer over said emitter layer;
      a collector layer over said base layer;
   b. removing a portion of said collector, base, and emitter layers to expose an edge of said emitter layer; and
   c. removing said emitter layer from between said base and emitter contact layer to form an undercut region beneath an edge of said base layer.

2. A method of claim 1, wherein said emitter layer is composed of AlGaAs and GaAs.

3. The method of claim 1, further comprising the step of forming a base contact on a portion of said base layer lying over said undercut region.

4. The method of claim 1, further comprising the step of forming said base and emitter contact layers of a first material and said emitter layer of a second material.

5. The method of claim 4, wherein said first material is GaAs and said second material is AlGaAs.

6. The method of claim 1, wherein said base layer, said collector layer, and said emitter layer are composed of silicon, and wherein said method includes the further step of doping said base and emitter contact layers a first conductivity, type and said emitter layer a second conductivity type.

7. A method of fabricating a bipolar transistor, comprising the steps of:
   a. providing a material structure comprising:
      a substrate;
      an emitter contact layer over said substrate;
      an emitter layer over said emitter contact layer;
      a base layer over said emitter layer;
      a collector layer over said base layer;
   b. forming a collector mesa by removing an upper portion of said collector layer;
   c. doping a lower portion of said collector layer lying over said base layer;
   d. removing portions of said lower portion, said base layer, and said emitter layers to expose an edge of said emitter layer;
   e. removing said emitter layer from between said base and emitter contact layers to form an undercut region beneath an edge of said base layer.

8. The method of claim 7, wherein said step of doping said lower portion of said collector layer includes doping said lower portion to be the same conductivity type as said base layer.

9. The method of claim 8, further comprising the step of forming a base contact on said lower portion of said collector layer.

10. The method of claim 7, further comprising the step of forming said base and emitter contact layers of a first material and said emitter layer of a second material.

11. The device of claim 7, wherein said base layer, said emitter layer, and said collector layer are composed of silicon, and said method includes the further step of doping said base and emitter contact layers a first conductivity type and said emitter layer a second conductivity type.

* * * * *